United States Patent [19]
Deas

[11] Patent Number: 6,041,422
[45] Date of Patent: *Mar. 21, 2000

[54] FAULT TOLERANT MEMORY SYSTEM

[75] Inventor: Alexander Roger Deas, Edinburgh, United Kingdom

[73] Assignee: Memory Corporation Technology Limited, United Kingdom

[*] Notice: This patent issued on a continued prosecution application filed under 37 CFR 1.53(d), and is subject to the twenty year patent term provisions of 35 U.S.C. 154(a)(2).

[21] Appl. No.: 08/959,963

[22] Filed: Oct. 24, 1997

Related U.S. Application Data

[63] Continuation of application No. 08/525,586, filed as application No. PCT/GB94/00577, Mar. 21, 1994, abandoned.

[30] Foreign Application Priority Data

Mar. 19, 1993 [GB] United Kingdom .................. 9305801

[51] Int. Cl.[7] ...................................................... G06F 11/20
[52] U.S. Cl. .................................................. 714/8; 712/17
[58] Field of Search ............................... 711/115; 712/10, 712/16, 17–32, 36

[56] References Cited

U.S. PATENT DOCUMENTS

| | | | |
|---|---|---|---|
| 3,222,653 | 12/1965 | Rice | 340/172.5 |
| 3,311,887 | 3/1967 | Muroga | 340/172.5 |
| 3,331,058 | 7/1967 | Perkins, Jr. | 340/172.5 |

(List continued on next page.)

FOREIGN PATENT DOCUMENTS

| | | |
|---|---|---|
| 0049629 | 10/1981 | European Pat. Off. . |
| 0082981 | 12/1982 | European Pat. Off. . |
| 0090175 | 2/1983 | European Pat. Off. . |
| 0136443 | 7/1984 | European Pat. Off. . |
| 0135780 | 8/1984 | European Pat. Off. . |
| 0142127 | 11/1984 | European Pat. Off. . |
| 0146357 | 12/1984 | European Pat. Off. . |
| 0178949 | 10/1985 | European Pat. Off. . |
| 0178950 | 10/1985 | European Pat. Off. . |
| 0336101 | 2/1989 | European Pat. Off. . |
| 0392895 | 3/1990 | European Pat. Off. . |
| 0434901 | 8/1990 | European Pat. Off. . |
| 0505652 | 3/1991 | European Pat. Off. . |
| 0486295 | 11/1991 | European Pat. Off. . |
| 1491702 | 5/1974 | United Kingdom . |
| 1550675 | 7/1976 | United Kingdom . |
| 2135485 | 1/1984 | United Kingdom . |
| 2165378 | 9/1985 | United Kingdom . |

(List continued on next page.)

OTHER PUBLICATIONS

Mitchell, Jr., M.J., "Alternate Storage Position Mechanism", IBM Technical Disclosure Bulletin, vol. 12, No. 9, pp. 1478–1479, Feb. 1970.

Aichelmann, Jr., F.J., "Fault–Tolerant Design Techniques for Semiconductor Memory Applications", IBM J. Res. Develop., vol. 28, No. 2, pp. 177–183, Mar. 1984.

Morris M. Mano, Digital Design, 1991, p. 247, 429–431.

*Primary Examiner*—Robert W. Beausoliel, Jr.
*Assistant Examiner*—Scott T. Baderman
*Attorney, Agent, or Firm*—Gifford, Krass, Groh, Sprinkle, Anderson & Citkowski, P.C.

[57] ABSTRACT

A fault tolerant semiconductor memory system has a main memory (1) having a first plurality of individually addressable storage locations. The system additionally has means for storing the address of ones of the storage locations which are defective, substitute memory comprising a second plurality of individually addressable storage locations mapped to corresponding ones of the defective storage locations, and control means comprising a plurality of comparators (20, 21, 23) for comparing a received address signal with a respective one of the addresses of the defective storage locations, each comparator being directly coupled to a corresponding one of the substitute storage locations, wherein read and write access can be re-routed from a defective storage location to the corresponding substitute storage locations.

17 Claims, 5 Drawing Sheets

U.S. PATENT DOCUMENTS

| | | | |
|---|---|---|---|
| 3,422,402 | 1/1969 | Sakalay | 340/172.5 |
| 3,434,116 | 3/1969 | Anacker | 340/172.5 |
| 3,633,175 | 1/1972 | Harper | 340/172.5 |
| 3,735,368 | 5/1973 | Beausoleil | 340/173 R |
| 3,753,244 | 8/1973 | Sumilas et al. | 395/442 |
| 4,015,126 | 3/1977 | Herrington | 250/320 |
| 4,250,570 | 2/1981 | Tsang et al. | 365/200 |
| 4,422,161 | 12/1983 | Kressel et al. | 365/200 |
| 4,426,688 | 1/1984 | Moxley | 365/200 |
| 4,450,559 | 5/1984 | Bond et al. | 395/182.04 |
| 4,523,313 | 6/1985 | Nibby, Jr. et al. | 371/10 |
| 4,527,251 | 7/1985 | Nibby, Jr. et al. | 364/900 |
| 4,532,611 | 7/1985 | Countryman, Jr. | 365/200 |
| 4,556,975 | 12/1985 | Smith et al. | 371/10 |
| 4,584,681 | 4/1986 | Singh et al. | 371/10 |
| 4,639,897 | 1/1987 | Wacyk | 365/200 |
| 4,656,609 | 4/1987 | Higuchi et al. | 365/200 |
| 4,656,610 | 4/1987 | Yoshida et al. | 365/200 |
| 4,744,060 | 5/1988 | Okajima | 365/200 |
| 4,745,582 | 5/1988 | Fukushi et al. | 365/200 |
| 4,783,781 | 11/1988 | Awaya | 371/10 |
| 4,796,233 | 1/1989 | Awaya et al. | 365/200 |
| 4,817,056 | 3/1989 | Furutani et al. | 365/200 |
| 4,849,938 | 7/1989 | Furutani et al. | 371/10 |
| 4,849,939 | 7/1989 | Muranaka et al. | 365/200 |
| 4,862,416 | 8/1989 | Takeuchi | 371/10.2 |
| 5,195,057 | 3/1993 | Kasa et al. | 365/200 |
| 5,208,782 | 5/1993 | Sakuta et al. | 365/230.03 |
| 5,243,570 | 9/1993 | Saruwatari | 365/201 |
| 5,249,156 | 9/1993 | Hagiwara et al. | 365/228 |
| 5,297,088 | 3/1994 | Yamaguchi | 365/200 |
| 5,315,551 | 5/1994 | Hirayama | 365/200 |
| 5,329,473 | 7/1994 | Cangiane | 364/726 |
| 5,381,370 | 1/1995 | Lacey et al. | 365/200 |
| 5,416,740 | 5/1995 | Fujita et al. | 365/200 |
| 5,822,779 | 10/1998 | Intrater et al. | 711/168 |

FOREIGN PATENT DOCUMENTS

| | | |
|---|---|---|
| 2209858 | 9/1988 | United Kingdom . |
| 2229021 | 1/1990 | United Kingdom . |
| 2254173 | 1/1992 | United Kingdom . |
| 2268295 | 1/1994 | United Kingdom . |
| 8302847 | 12/1982 | WIPO . |
| 8500460 | 5/1984 | WIPO . |
| WO8700674 | 1/1987 | WIPO . |
| WO8702487 | 4/1987 | WIPO . |
| WO8703716 | 6/1987 | WIPO . |
| WO8912320 | 12/1989 | WIPO . |
| 9101023 | 7/1990 | WIPO . |
| WO9009634 | 8/1990 | WIPO . |
| WO9012399 | 10/1990 | WIPO . |
| 9208193 | 11/1991 | WIPO . |

FAULT TOLERANT MEMORY SYSTEM

This is a continuation of application Ser. No. 08/525,586 filed on Oct. 30, 1995 which is a 371 of International Application PCT/GB94/00577 filed on Mar. 21, 1994 and which designated the U.S., now abandoned.

FIELD OF THE INVENTION

The invention relates to a fault tolerant memory system and is applicable in particular, though not necessarily, to semiconductor memory systems.

DESCRIPTION OF THE RELEVANT PRIOR ART

In the semiconductor industry, solid state memory devices are fabricated as die on wafers of silicon, each die containing a memory array. These die are tested and the die which work perfectly are packaged for use. Faulty die may be graded; those die with only a few defective cells may be used in applications where a small number of defects can be tolerated, such as voice recording, or the die may be discarded as useless. Faulty die have a value which is, at best, 20% of the value of perfect working die despite the faulty die possibly containing only a few defective memory locations. If the faulty locations could be replaced with working locations then these faulty die could be used as memory devices.

The prior art includes many different methods of solving the problem of faulty memory locations. For example EP-A-0090175 describes a system whereby information in the memory is encoded to provide redundancy through which bit errors can be corrected. This system is however computationally intensive and too slow to be of practical use.

One class of solutions in the prior art involves utilising additional memory capacity which is substituted for faulty locations as required. U.S. Pat. No. 3,633,175 describes a system for substituting redundant rows of cells for known faulty locations. The system stores the word address of each row which contains a fault in a content addressable memory together with the address of a known good row in the substitute memory.

The address to be accessed is compared with the addresses of defective main memory locations. Should the two addresses compared be identical, an auxiliary address is accessed which directs the information exchange to the substitute address location in the substitute memory. Similar systems are described in U.S. Pat. No. 3,311,887 and 3,422,402 and in UK patent 1,550,675 which uses a PLA to intercept the address generated by the host processor and determine whether or not a faulty location is being accessed. If a faulty location is being accessed it uses additional logic to select a suitable memory location, at least one such substitute location being provided for each defective location of the main memory.

UK patent 1,491,702 describes a data checking device for a memory system and which is responsive to a data item read out from a selected storage location in the main memory. If the data item read out contains an error then the location is faulty and a signal is set which causes an address code converter to assign a replacement location in the substitute store for use when the faulty location in main memory is accessed. Thus, this system relies upon generating an address from the address originally used to access the faulty location.

It is an object of the present invention to avoid or minimize one or more of the disadvantages of the prior art.

It is a further object of the present invention to provide a means for utilizing memory chips having a small number of defective memory cells in an economic manner. It is also an object of the present invention to obviate the need to store addresses of working locations to replace the faulty locations.

Conventionally, solid state memory devices are organised by row and column. For example, a byte wide 16 Mbit chip will comprise 2M ($2\times2^{20}$) rows each of 8 memory cells.

The bulk of the surface area of a semiconductor memory chip is comprised of the memory cells with only a small portion of the surface of the chip occupied by the row and column drivers. The result of this allocation of memory module and driver space is that the probability of a row or column driver failing is much lower than the probability of a single memory cell or small cluster of memory cells failing. Therefore, many chips which are partially working have perfect column and row drivers and only some of the cells within the memory array are faulty. Further consideration of the probability of a failure suggests that even with a process yield as low as 1%, the number of faulty memory cells on any single chip is less than eight. The inescapable conclusion is that many partially working devices are discarded even though the vast majority of memory locations on that device are in perfect working order. Most of the faulty chips sold have very few faulty cells, yet they are worth only a fraction of the value of chips which work perfectly.

SUMMARY OF THE INVENTION

This problem is solved by using an integrated circuit containing an associative memory device to record the exact locations of individual defective cells in main memory and to divert access from these faulty cells via respective dedicated lines to working cells held in a substitute memory store, to provide the minimum memory function at the address of the faulty cells without the need for generating new addresses for the new, substitute, memory locations.

This approach avoids the need to use a complete memory chip per block of partially working memory chips and provides fast memory access. Since most faulty memory chips contain very few faulty locations, the substitute memory may be very much smaller than the main memory.

The present invention provides a fault tolerant memory system comprising a main storage area having a first plurality of addressable storage locations, means for enabling read and/or write access to ones of said storage locations upon receipt of an address signal, means for storing the address of ones of said first plurality of storage locations as defective locations, substitute storage means comprising a second plurality of addressable storage locations mapped to corresponding ones of said storage locations stored as defective, and control means for identifying said received address signal as corresponding to one of the storage locations stored as defective and for re-routing the read and/or write access from the storage locations stored as defective to the corresponding storage location of the substitute storage means, the system being characterised in that the control means comprises a plurality of comparators, each comparator being arranged to compare said received address signal with a respective one of the addresses of said storage locations stored as defective and each comparator being coupled via a corresponding dedicated line to a corresponding one of said substitute storage locations for enabling a read and/or write access to be re-routed to the corresponding substitute storage location if said received address is the same as the address of the storage location stored as defective.

Thus, in our invention there is a dedicated line e.g. permanant hard wired connection between the comparator which stores the address of the faulty location and the memory element which is used as a substitute storage location which avoids the need for storing the address of the substitute memory location and subsequent decoding thereof.

Where it is desired to use the Substitute Store only for data with individual defective memory cells, as opposed to storing entire bytes, then once data transmission for those has been diverted to the Substitute Store, data transmissions for the other cells (bits) in the row containing the individual defective cells, may be passed on to the main memory device.

It will of course be understood that certain embodiments of the present invention can contain more than one memory device or chip, i.e. a bank of say 8 or 16 of these, all served by a common Substitute memory, Associative Store means etc.

BRIEF DESCRIPTION OF THE DRAWINGS

For a better understanding of the present invention and to show how the same may be carried into effect reference will now be made, by way of example, to the accompanying drawings, in which.

DETAILED DESCRIPTION OF THE PREFERRED EMBODIMENTS

Figure 1:
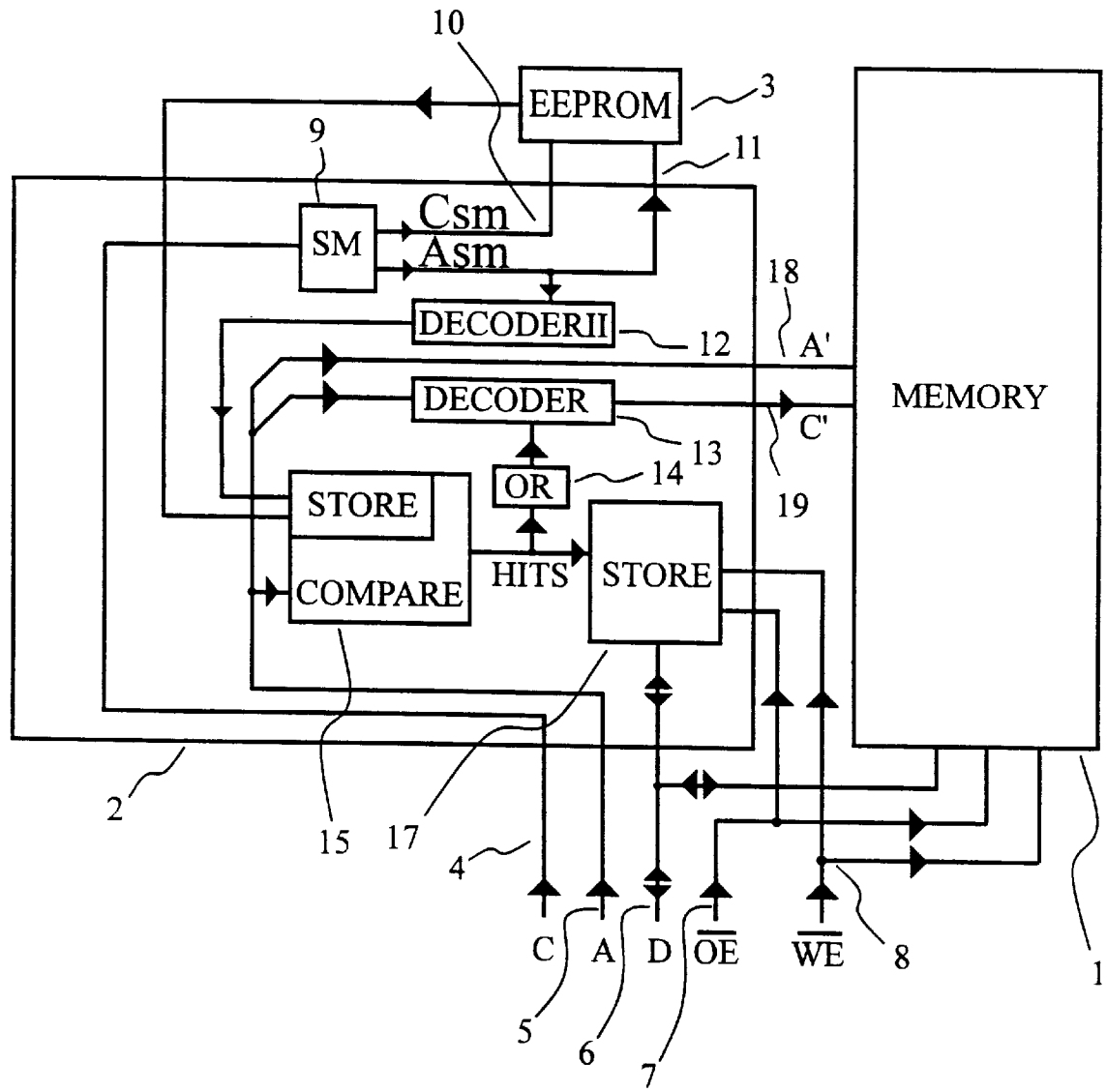
FIG. 1 shows in diagrammatical form a fault tolerant memory system.

FIG. 1 shows a memory system with an application specific integrated circuit (ASIC) 2 that is an integrated circuit customised for its specific application, coupled to a SRAM (Static RAM memory device) 1 for utilising partly working SRAM memory devices in blocks of eight, although the system may be used with any other convenient memory technology, for example FLASH memories, EPROM, DRAM or ferroelectric technology memories in any form factor.

The particular SRAM fabrication process used should be considered to determine the maximum acceptable level of redundancy below which partly working memory arrays can be utilised. For example, with a 16 Mbit SRAM, partly working memory arrays may be graded such that memory arrays with up to 16 defective memory cells are accepted for inclusion into modules such as SIMMs, PCMCIA cards and pseudo disk drives, utilising the system described herein.

It is envisaged that the memory devices are tested at the factory and the faulty locations are programmed into nonvolatile memory within, or available to, the ASIC 2. In another embodiment of the invention, the ASIC 2 may include additional means for testing the memory device 1, determining the faulty locations upon power up, and programming them into non-volatile memory.

FIG. 1 also shows an EEPROM which provides the non-volatile memory 3, and Address 5, Data 6 and Control 4 Buses A, D, C, from the apparatus in which the memory device 1 is being utilized.

In FIG. 1 the EEPROM 3 which stores the addresses of faulty locations in the main memory is outside the ASIC 2, although in another embodiment it could be within the ASIC, in which case the Data Bus 6 would go to the EEPROM 3. As already indicated the EEPROM is programmed with the addresses of faulty locations before it is connected to the memory device 1. In addition to the bits needed to address uniquely each memory location there is an extra bit (the most significant bit in this case) which is zero by default but is set to one if the location accessed by this address is faulty. This extra bit is necessary for those cases where the EEPROM is not completely filled with addresses of faulty locations.

When power is supplied to the memory device 1 the reset line goes active which initialises a state machine 9 and causes it to cycle through its states. The state machine 9 is implemented using one D-type register per state. The first state is a "no operation" state. The state machine 9 remains in this state (the first state) until a reset signal is received. Once a reset signal is received the counter is reset and the state machine 9 enters state two.

The second state is another single clock cycle "no operation" state included for timing purposes, although it may not be necessary.

The third state enables the EEPROM 3 by setting the $C_{sm}$ line 10 active, thus ensuring that data can be latched from the EEPROM 3 storage registers of an Associative Store 15. The address decoderII 12 decodes the B bits (required to uniquely address each of the M bytes, providing N faulty address locations stored in the EEPROM) generated by the counter which is controlled by the state machine.

The number of bytes (M) in the address which are required to access the entire range of locations in main memory is used to determine the number X, where $X=2^Q$ and Q is a natural number, such that X is greater than M. This number (X) multiplied by the number of faulty locations (N) to be recovered determines the number of address permutations (P) which the counter, controlled by the state machine, must generate to access each of the P bytes stored in the EEPROM. To generate P permutations the counter must have B bits, where $2^B=P$ Each byte stored in the EEPROM contains part of the address of one faulty location in the main memory. For example, if 16 fault locations are to be replaced and 23 bits are needed to address the main memory then the state machine must generate 64 permutations, i.e. it needs 6 bits (since $2^6=64$). This is because:

$$M = 23 \text{ bits}/8 \text{ bits} = 2.875 \text{ bytes}$$

$$\Rightarrow Q = 2 \text{ since } 2^2 = 4 \geq M \geq 2^1 = 2$$

$$\Rightarrow X = 2^2 = 4$$

$$\Rightarrow P = 4 \times 16 \text{ faulty locations}$$

$$\Rightarrow P = 64 \text{ permutations}$$

$$\Rightarrow B = 6 \text{ bits}$$

The Q least significant bits (Q-1:0) of the B bit address are used to select which of the X single byte registers in each element of the Associative Store 15 is selected. The bits (B:Q) are used to select which element in the Associative Store 15 is selected, where each element can contain the address of one faulty memory location. The B bit address generated by the counter is also sent to the EEPROM 3 via the state machine address bus $A_{sm}$ 11. The EEPROM decodes this address to select a single byte of data. The state machine 9 remains in the third state for only one clock cycle before entering the fourth state. on the transition from the third to fourth state data is latched from the EEPROM 3 to the Associative Store 15.

During the fourth state the EEPROM 3 is still enabled. At the end of the fourth state the counter within the state machine 9 is incremented and the EEPROM is disabled by the state machine control ($C_{sm}$) lines 10; both of these actions occur on the falling edge of the signal generated by the fourth state.

The fifth state checks whether the counter has reached its maximum value. It does this either by checking whether or not the carry flag is set. Alternatively an extra bit could be included (the counter would have to generate B+1 bits in this case) which could be tested. If the carry is set (or alternatively if the most significant bit is set) then the state machine enters state 6, otherwise it returns to state 2.

When the state machine reaches the sixth state it remains there in a "no operation" state.

Each individual memory device unit (not shown) in the bank/array forming the memory device 1 requires Y address bits to access its full range of locations and Z bits are required to distinguish the memory device units themselves, where Z is $\log_2 W$ and W is the number of memory devices. Thus, the address on the Address Bus 5 needs Y+Z bits to address uniquely each memory location. The address decoder 13 receives the Z address bits from the host processor and uses these address bits to select the appropriate memory device unit in the memory device 1. The other address bits (the Y address bits, marked A' on FIG. 1) are used to select the appropriate memory location on a chosen memory device unit.

Figure 2:
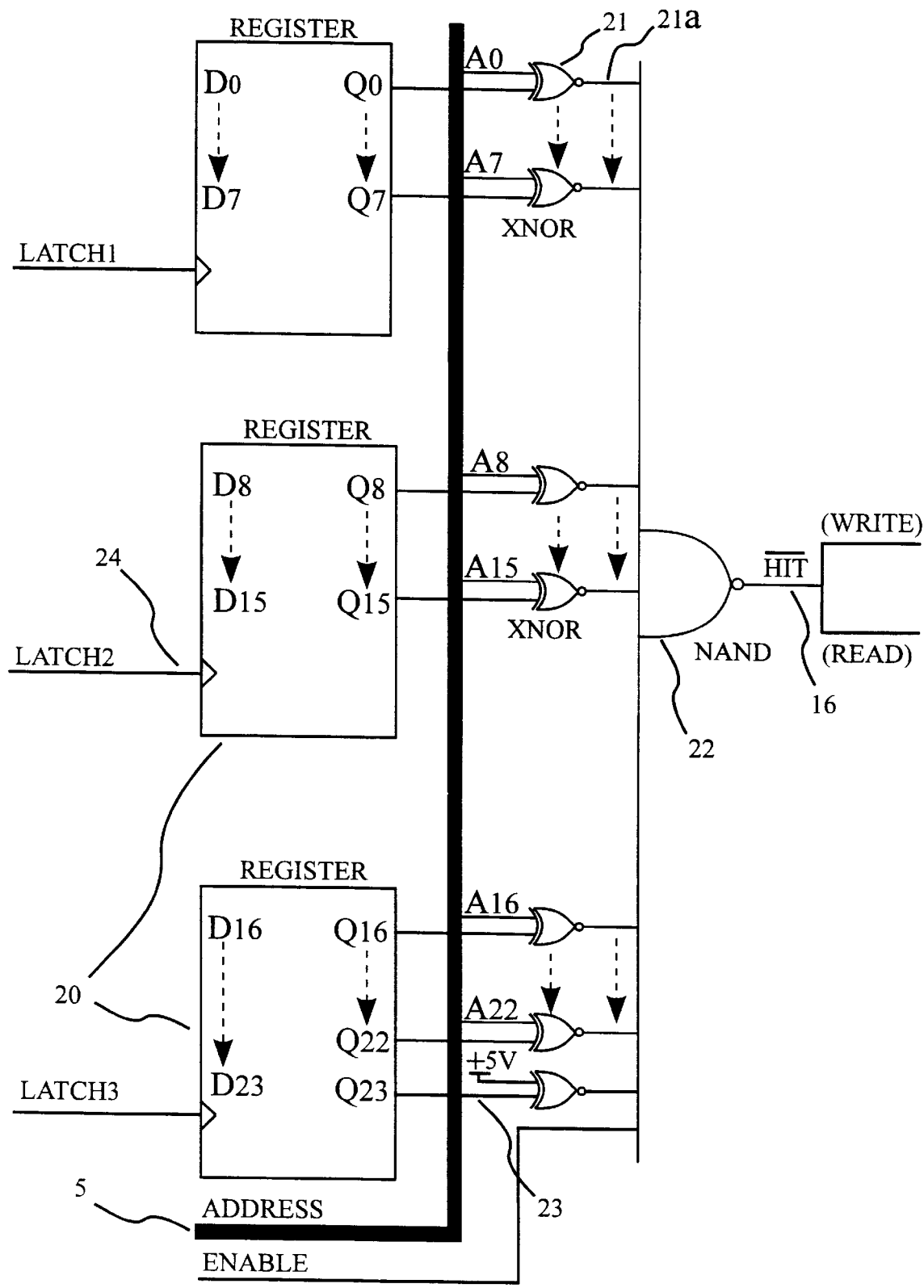
FIG. 2 shows a comparator of the system of FIG. 1.

The Associative Store 15 consists of a number of elements, one element for each faulty location which has to be replaced. Therefore, each element must be able to store the number of bits required to address uniquely every memory location and one additional flag bit to show whether the address stored corresponds to a faulty location. Typical registers are eight bits wide so that if, for example, 23 address bits are used then 3 registers per element are required to hold the address of one faulty memory location. The total number of registers required in this case is 3 ×N, where N is the number of faulty locations which are to be replaced. FIG. 2 shows one element of the Associative Store.

Figure 3:
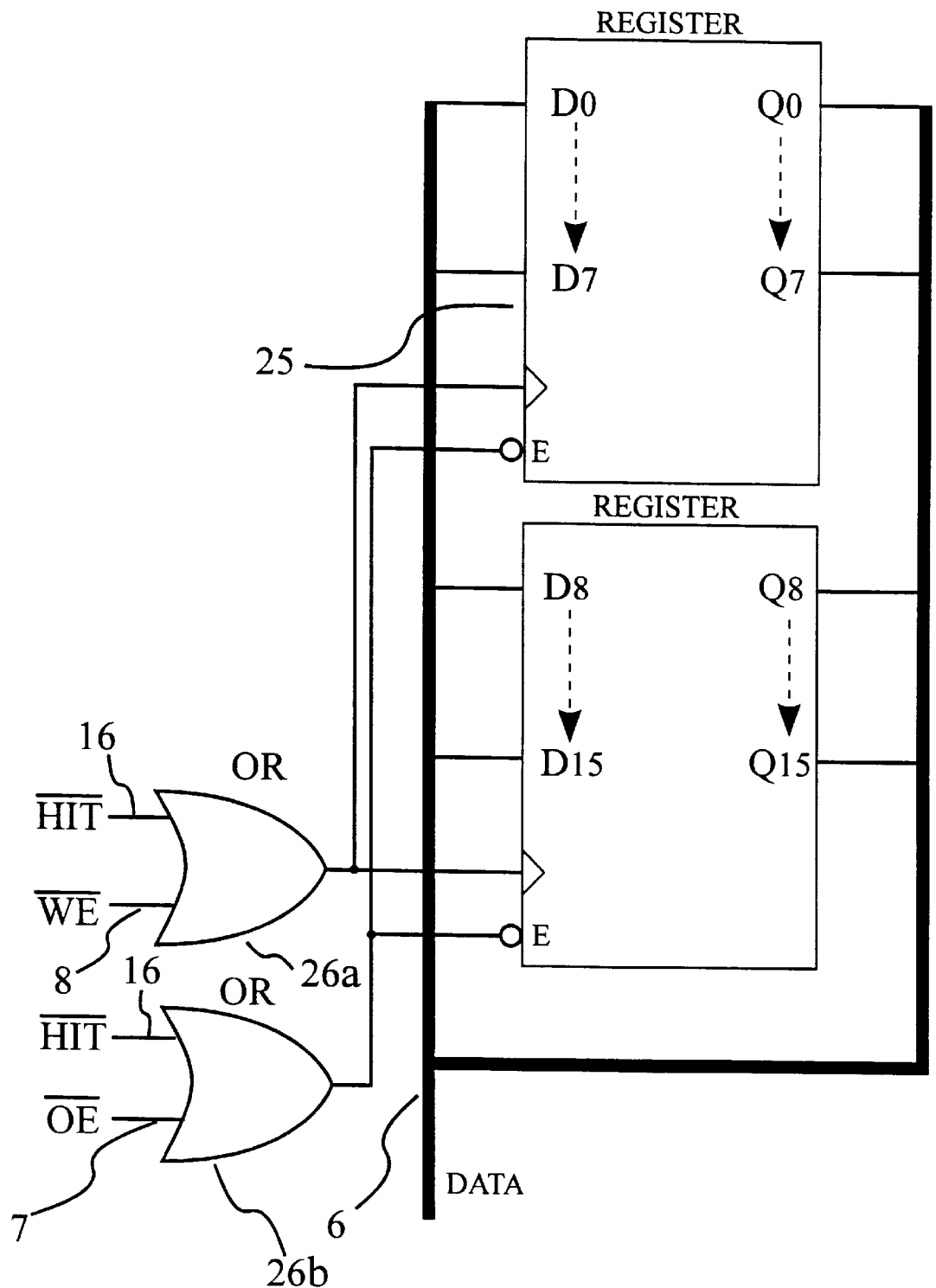
FIG. 3 shows a substitute store of the system of FIG. 1.

Each of the outputs from each register 20 goes to a corresponding comparator or comparison making means within the Associative Store 15 to be compared with the corresponding bit of the current address 5 generated by the host. In FIG. 2 the comparison making means consists of one exclusive NOR (XNOR) gate 21 for each bit and a multi-input NAND logic function 22. If the two addresses are identical then all resultant XNOR output signals will be logic one, which can be detected by a multi-input NAND logic function 22, the output 16 of which then acts as an enable for the corresponding Substitute Store 17 element. The MSB (most significant bit) of data 23 stored by each Associative Store element is compared with logic one, i.e. the corresponding XNOR gate has one of its inputs wired permanently to logic one, the other input being the flag bit stored as the MSB in the EEPROM 3. The output 21a of each XNOR gate goes to a multi-input NAND gate 22 which generates an active-low HIT signal output 16 when the stored address of the element matches the current address requested by the host and the MSB flag bit is set to logic one. For every faulty memory location to be replaced there exists one element in the Associative Store 15. The incoming address on the Address Bus 5 is compared with each element simultaneously. If any one of these elements matches the incoming address then the HIT signal generated by that element accesses an element in the Substitute Store 17. Each element in the Associative Store 15 is coupled via a dedicated line 16 (one of which is shown in FIG. 2) to one element in the Substitute Store 17 (FIG. 3). Hence the Associative Store 15 does not need to store the address of the Substitute Store element it accesses: each element in the Associative Store merely enables or disables its corresponding entry in the Substitute Store 17, depending on whether or not a HIT occurs.

As indicated above, the Substitute Store 17 consists of a number of elements, one for each faulty location which is to be replaced. Each element consists of registers for storing the same number of data bits as are stored in each location in the main memory (typically 8 bits or 16 bits). If the HIT signal 16 from a particular element in the Associative Store 15 is active then the main memory 1 is disabled and the element in the Substitute Store 17 corresponding to that element in the Associative Store which caused the HIT signal 16 is selected for reading or writing, depending on whether a read or write command was initiated by the host processor. A logical OR operation 14 is performed on the HIT signals 16 from the Associative Store elements 15. If the address stored on one of the Associative Store elements matches the address generated by the host 5 then the appropriate HIT signal is activated and so the OR gate output changes, disabling the main memory device 1 by disabling the address decode circuitry 13. FIG. 3 shows one element of the Substitute Store 17 which stores 16 bits of data in two registers 25, coupled to provide the equivalent storage space of each location in the main memory device 1.

The HIT and WE (write enable) lines go to a two-input OR gate 26a. The output of this OR gate 26a is used to control the writing of data from the data bus 6 to registers 25. When WE and HIT are asserted low the output of the OR gate 26a goes high. The transition of this state from low to high causes data to be clocked into the registers 25. The HIT and OE (output enable) lines go to a second two-input OR gate 26b. THe output of this OR gate 26b is used to control the reading of data from the registers 25 onto the data bus 6. When OE and HIT are both asserted low the output of the OR gate 26b is pulled low which enables registers 25 and makes the data stored on the registers 25 available for reading. When either of the inputs of the OR gate 26b goes high the output of the OR gate 26b goes high. This transition forces the output of the registers 25 to a high impedance state.

During normal operation of the memory device 1 a host processor requests either a read or write operation with the memory device 1 as its target. In the case of a write command the host processor puts an address on the Address Bus 5. The incoming address is intercepted by the ASIC 2 and the address is sent to the Associative Store 15. In parallel with the access to the Associative Store 15, the lower Y address bits are applied to the bank of partly working memory device units to access the full range of memory locations on one chip and the upper Z bits are used to select the appropriate chip in the memory device 1. If each of the memory chips has only one enable then $\log_2 W$ (where W is the number of chips) address bits are required (i.e. $Z=\log_2 W$) and W lines are needed to enable these chips. If each of the memory chips has two enables then the chips can be arranged by rows and columns; W address bits are still required but in this case fewer lines are required to enable these chips, for example if 80 chips are needed then they can be arranged in an 8×10 matrix, which only needs 18 enable lines.

If no HIT occurs in the Associative Store 15, i.e. the incoming address on the Address Bus 5 does not match any of those addresses stored in the Associative Store, the memory device 1 is allowed to respond to the write operation as normal. If the incoming address on the Address Bus 5 matches one of the addresses stored in the Associative Store 15 then a HIT occurs. When a HIT occurs the memory device 1 is disabled or inhibited before it can receive data from the host processor and the Substitute Store 17 within the ASIC 2 is enabled. The element in the Substitute Store 17 which was enabled by the HIT signal from the corresponding element in the Associative Store 15 receives data from the host processor via the Data Bus 6.

During a read operation the host processor puts an address on the Address Bus 5. The incoming address is intercepted by the ASIC 2 and the address is sent to the Associative Store 15. In parallel with the access to the Associative Store 15, the lower Y address bits are applied to the memory device 1 to access the full range of memory locations on one memory device unit and the upper Z bits are used to select the chip. If no HIT occurs in the Associative Store 15, i.e. the incoming address on the Address Bus 5 does not match any of those addresses stored in the Associative Store 15, then the memory device 1 is allowed to respond to the read operation as normal. If the incoming address on the Address Bus 5 matches one of the addresses stored in the Associative Store then a HIT occurs. When a HIT occurs the memory device 1 is disabled or inhibited before it can output data onto the Data Bus 6 and the Substitute Store 17 within the ASIC 2 is given control of the Data Bus 6. The element in the Substitute Store 17 which was enabled by the HIT signal from the corresponding element in the Associative Store 15 puts its data onto the Data Bus 6, which goes directly to the host processor.

Thus, during both read and write operations the complete memory system behaves as if it was a single main memory in that a host processor has access to a continuous range of working memory locations.

The embodiment described above utilises multiple byte substitute storage locations to replace corresponding multiple byte defective locations which may contain only a single, or a small plurality, of defective bits. In another embodiment there could be used single byte substitute storage locations to replace corresponding single byte defective locations. Thus, alternative embodiments of this invention may make use of an associative Store 15 configured to record individual faulty memory cells, the memory device 1 being allowed to respond on some data bit lines with the substitute store 17 being arranged to replace only the damaged bit lines. In this case, the Data Bus 6 is not passed in parallel to the memory device 1 and the Substitute Store 17; instead it is first passed to the memory device 1 and the necessary control logic in the ASIC 2, then to the Substitute Store 17. The Associative Store 15, or some additional circuitry, has the necessary logic to determine which of the bits on the Data Bus should come from the main memory device 1 and which should come from the Substitute Store 17. Since the Data Bus is buffered by the ASIC 2, the buffering introduces a delay which will increase the memory device 1 access time marginally.

To optimise performance, the access time of the associative store 15 and the substitute store 17 on the ASIC must be less than that of the memory device 1.

Where the embodiment recovers individual memory device cells, the Data Register 14 is a single cell and a Bit Mask Register is used to control the Data Bus buffer with a suitable signal on Control Bus C so that the memory device 1 supplies the memory cells for the known good data bits and the ASIC 2 substitutes for the faulty memory cell(s).

Figure 4:
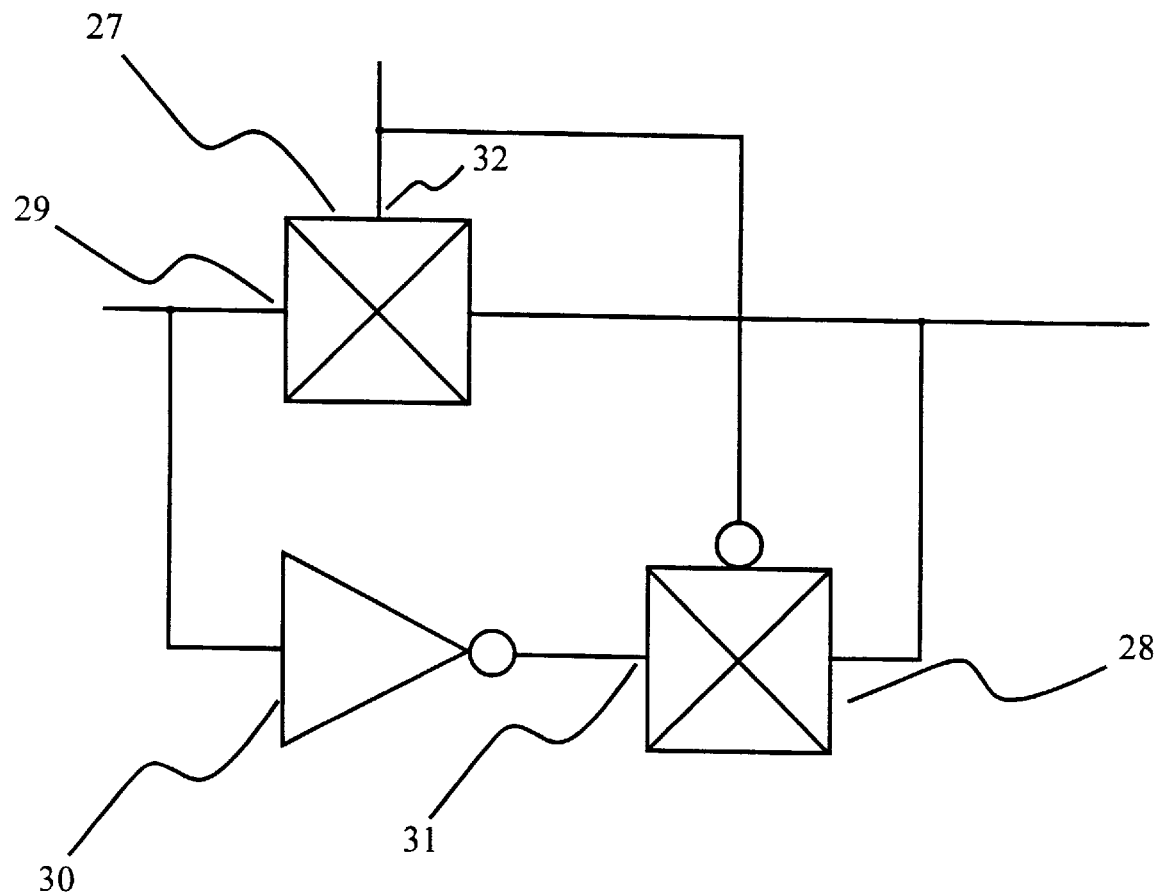
FIG. 4 shows a modification which may be made to the comparator of FIG. 2.

The exclusive-NOR logic function 21 within the Associative Store 15 as shown in FIG. 2 may be too slow and expensive in chip area for some applications and accordingly FIG. 4 shows an alternative implementation of this function. In this case, first and second transmission gates 27, 28 are formed and arranged so that a single bit of the decoded-address bus is applied to the input 29 of the first transmission gate 27 and its complement, obtained via an inverter 30, is applied to the input 31 of the second transmission gate 28. The corresponding address bit from the Associative Store Registers 20 containing the address of a defective cell (see FIG. 2) is applied to the control input of the first transmission gate 32 and its compliment to the control input of defective memory cell address bit is high, the first transmission gate 27 is open and the second 28 is closed; and when said address bit is low, the first transmission gate 27 is closed and the second one 28 is open. With this arrangement, the result of the individual address-bit-compares is that the output signal will be logic high when the two addresses being compared are the same.

With regard to the coupling of the Address 5, Data 6 and Control 4 Buses to the memory device 1 and the other parts of the system (which as shown in the illustration may all conveniently be implemented within one ASIC 2), it will be appreciated that various arrangements are possible depending on the particular mode of operation required.

Figure 5:
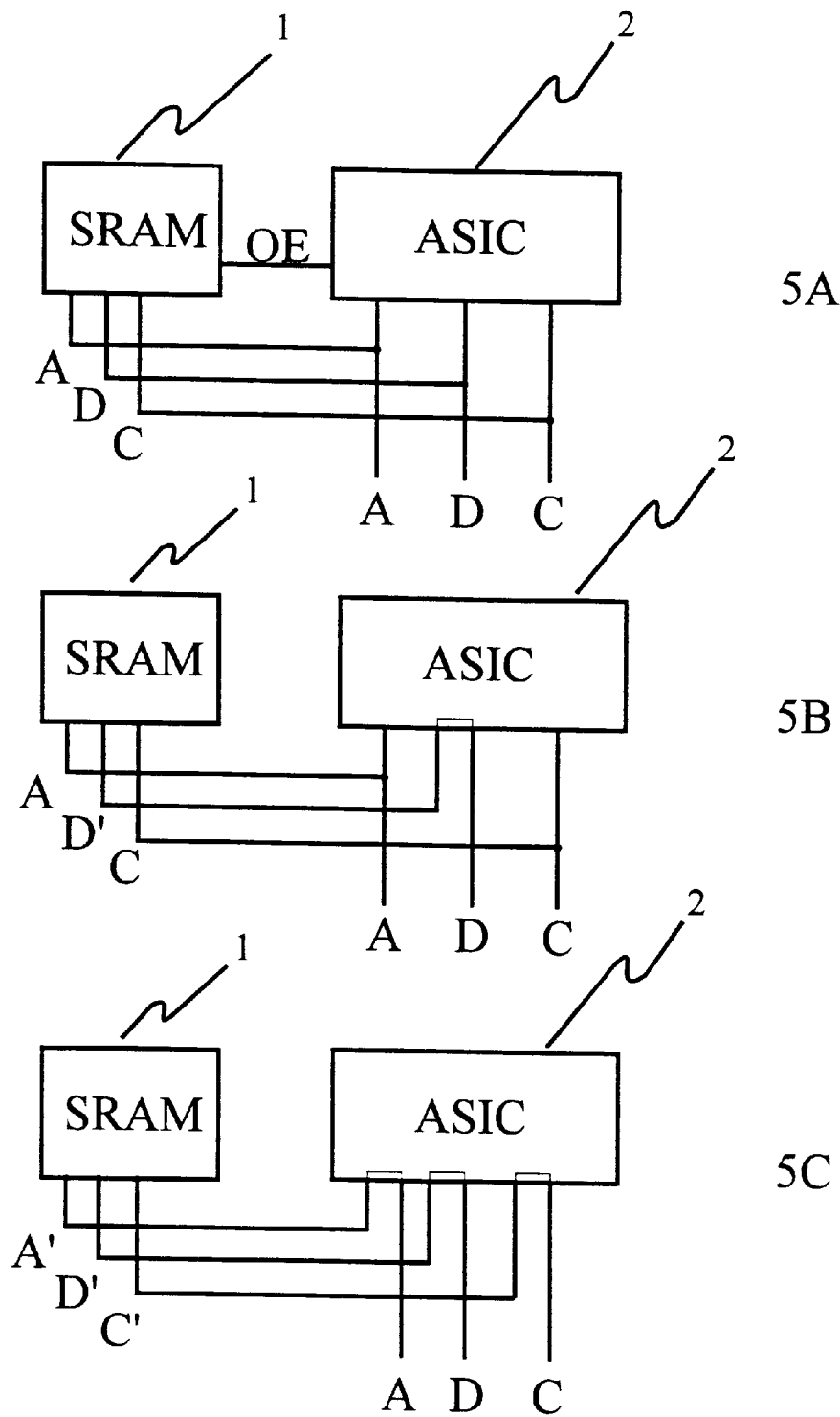
FIG. 5 shows possible interconnection paths which may be made between an ASIC and SRAM in accordance with three different embodiments of the invention.

Alternative implementations are illustrated in FIG. 5 in which the Address bus, Data Bus, and Control Bus are labelled A, D and C respectively. If the signals in a bus are modified by the ASIC circuitry 2 then the bus links to the memory device are shown primed. (The memory device shown is SRAM i.e. Static RAM or could be DRAM i.e. Dynamic RAM).

FIG. 5A shows an arrangement used for row recovery. The ASIC 2 intercepts accesses to known faulty memory cell locations and replaces the function of an entire row of memory cells. The row output-enable lines of the control bus C group are replaced by output enable lines in a direct control bus OE between the ASIC and the memory device. This permits the normal memory device to be inhibited when data for a row containing a defective memory cell is being written to or read from.

FIG. 5B shows an arrangement used for cell recovery. The Data Bus 6 is routed through the ASIC in order that the individual data bits from a word destined for a row containing one or more defective memory cell may be intercepted and those corresponding to defective memory cells diverted to the substitute memory store while the others are passed on to the good cells in the memory device row. The complete Address bus and Control bus go to both the ASIC 2 and the memory device 1.

FIG. 5C shows an arrangement which permits the auto-test feature to be implemented. On power-up the ASIC 2 has control of the entire memory device interface and so can proceed with memory test without interfering with the host processor. The ASIC 2 has both hardware and software protocols to enable the host processor when the test sequence has been compelted.

It will be appreciated that various modifications may be made the above described embodiments within the scope of the present invention. For example, the registers 20 may be non-volatile so that the addresses of defective storage locations may be permanently stored therein. Such an embodiment would not require the EEPROM 3 or the state machine 9 to load addresses into the registers on power up.

I claim:

1. A semiconductor memory device including at least one memory cell array chip, coupled to an off-chip application specific integrated circuit device (ASIC) (2), said ASIC including a redundancy configuration comprising a redundancy memory cell array (17), a defective memory address storing circuit (3), an address comparing circuit and a redundancy memory cell selecting circuit (21,22,14), said ASIC further including associative storage means (15) having a plurality of storage elements each of which is coupled to a corresponding element in said redundancy memory cell array (17) and control means (16) for enabling or disabling said corresponding element according to whether an associated element in said at least one memory cell array chip is accessed or not, wherein:

said redundant memory cell array (17) comprises a plurality of substitute storage locations (25) mapped to corresponding defective locations in said at least one memory cell array chip, and said address comparing circuit comprises a plurality of comparators (21) each of which is arranged to compare a received address signal with a corresponding one of the addresses of the defective locations and which is coupled via a corresponding dedicated line to a corresponding one of the substitute storage locations (25) for enabling a read and/or write access to that substitute location and for disabling said at least one memory cell array chip if the compared addresses match; and each of the storage elements of the associative storage means comprises a register means (20) for storing as a binary word the address of one of a plurality of defective locations in said at least one memory cell array chip and wherein each of the comparators is arranged individually to compare each of the bits stored in the register means with corresponding bits of the received address and to combine the results of the individual comparisons to provide a comparison result.

2. A memory device according to claim 1 wherein each register means (20) stores an additional flag bit for indicating whether or not the address stored therein is in fact the address of a defective location.

3. A memory device according to claim 1 wherein said individual comparisons are made by respective two input NOR gates.

4. A memory device according to claim 1, wherein said individual comparisons are made by first and second transmission gates coupled together in parallel, the transmission gates receiving as a control input one of an address bit and a register bit and as a data input the other address bit and the register bit.

5. A memory device according to claim 1 wherein the individual comparisons made by each comparator are combined by means of a multi-input NAND gate.

6. A memory device according to claim 1 wherein each of the register means comprises a plurality of 8-bit registers.

7. A memory device according to claim 1 wherein said at least one memory cell array chip has a chip select input for selectably enabling or disabling said chip, the chip select input being arranged to receive a disable input when any one of the address comparisons produces a match.

8. A memory device according to claim 7 wherein said redundancy memory cell selecting circuit comprises means (14) for combining said comparison results of the plurality of comparators to provide a signal for disabling said at least one memory cell array chip in the event that the received address matches one of the addresses corresponding to a defective location.

9. A memory device according to claim 8 wherein the combining means is a multi-input OR gate.

10. A memory device according to claim 8, including a plurality of memory cell array chips and an address decoder (13) arranged in normal use to receive a plurality of address lines carrying data identifying which memory cell array chip is to be selected and to transmit an enable signal to the chip enable input of the selected chip, the output of the combining means (14) being coupled to the address decoder (13) so that if any of the comparators produce a match, transmission of the enable signal is prevented.

11. A memory device according to claim 1, including a plurality of memory cell array chips coupled to said off-chip ASIC.

12. A memory device according to claim 1, wherein means for enabling read and/or write access is arranged to enable read write access.

13. A memory device according to claim 1, wherein said associated element in said at least one memory cell array chip consists of a single defective location.

14. A memory device according to claim 1, wherein said associated element in said at least one memory cell array chip comprises a plurality of locations, including a defective location.

15. A memory device according to claim 1, wherein said defective memory address storing circuit (3) is located outside a main body of the ASIC device (2).

16. A semiconductor memory device including at least one memory cell array chip, coupled to an off-chip application specific integrated circuit device (ASIC) (2), said ASIC including a redundancy configuration comprising a redundancy memory cell array (17), a defective memory address storing circuit (3), an address comparing circuit and a redundancy memory cell selecting circuit (21,22,14) said ASIC further including associative storage means (15) having a plurality of storage elements each of which is coupled to a corresponding element in said redundancy memory cell array (17) and control means (16) for enabling or disabling said corresponding element according to whether an associated element in said at least one memory cell array chip is accessed or not, wherein said defective memory address storing circuit comprises a non-volatile ROM memory for storing as a plurality of bytes addresses of defective storage locations in said at least one memory cell array chip, the device being arranged to download said address information contained in the non-volatile ROM memory to the associative storage means (15) on power up of the device.

17. A memory device according to claim 16 further including a counter (9) for counting up to the number of bytes contained in the non-volatile ROM memory for clocking the bytes out of the ROM memory.

* * * * *